United States Patent [19]

Morihisa

[11] 4,091,338
[45] May 23, 1978

[54] CRYSTAL OSCILLATOR IMPLEMENTED WITH CMOS TECHNOLOGY

[75] Inventor: Mitsuo Morihisa, Nara, Japan

[73] Assignee: Sharp Kabushiki Kaisha, Osaka, Japan

[21] Appl. No.: 760,522

[22] Filed: Jan. 19, 1977

[30] Foreign Application Priority Data

Jan. 19, 1976 Japan .................................. 51-5220
Mar. 18, 1976 Japan .................................. 51-30041
Jul. 12, 1976 Japan .................................. 51-83238

[51] Int. Cl.² ............................................ H03B 5/36
[52] U.S. Cl. ........................... 331/116 R; 331/108 D
[58] Field of Search .......... 331/116 R, 108 C, 108 D, 331/158; 58/23 AC, 23 V, 23 A, 23 R Primary Examiner—John Kominski
Attorney, Agent, or Firm—Birch, Stewart, Kolasch & Birch

[57] ABSTRACT

In a crystal oscillator for solid state wristwatches, the input of an impedance converter is connected to the output of a complementarily connected transistor amplifier which performs linear operation within its essential operating range, thereby stabilizing and decreasing output impedance of the amplifier on the average. The impedance converter includes one or more active elements such as MOSFET's, junction type FET's and bipolar transistors. A quartz oscillator is connected between the input of the complementarily connected transistor amplifier and the output of the output impedance converter.

7 Claims, 24 Drawing Figures

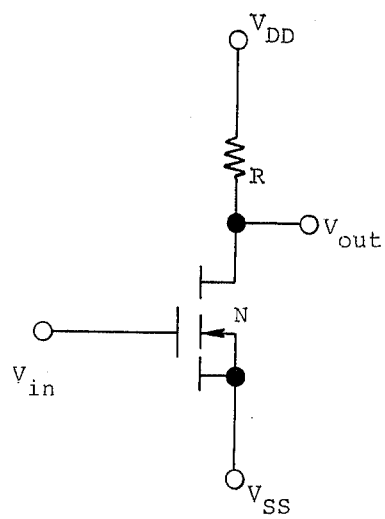
FIG. 13
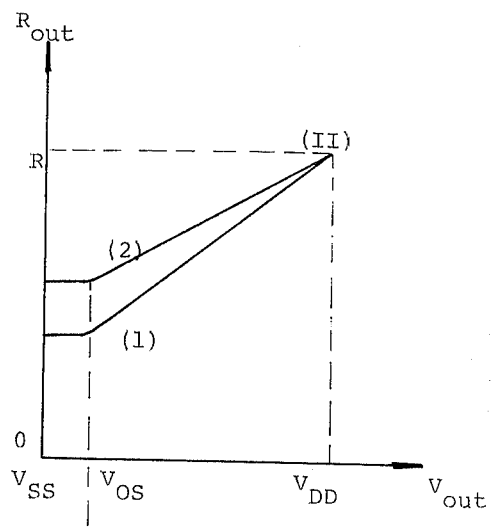
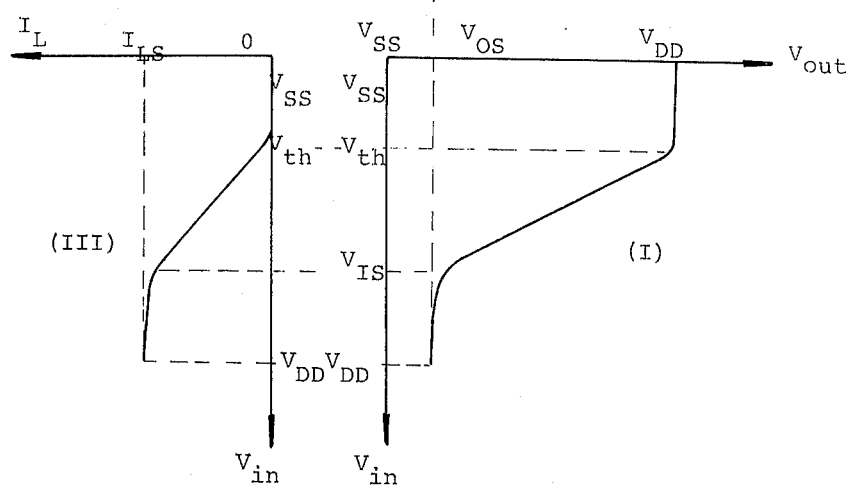
FIG. 14

CRYSTAL OSCILLATOR IMPLEMENTED WITH CMOS TECHNOLOGY

BACKGROUND OF THE INVENTION

The present invention relates to CMOS amplifiers useful for crystal oscillators.

In the past, a CMOS analog amplifier as illustrated in FIG. 1 was employed as an amplifier in crystal oscillators for a variety of electronic apparatus for example solid state wristwatches to fulfill low power consumption requirements. The amplifier includes a basic inverter consisting of a P-channel MOS transistor P and an N-channel MOS transistor N, and a resistor $R_f$ of a high resistance value connected between an input terminal $V_{in}$ and an output terminal $V_{out}$ of the complementary MOS inverter for biasing purposes. Advantageously, the circuit exhibits high gain, low power dissipation performance characteristics while keeping a simplicity in circuit construction.

Nevertheless, one difficulty is experienced in reducing the output impedance in the vicinity of the operating center of the CMOS inverter. If the output impedance is forced into a low impedance state, there will be created requirements that the mutual conductance of the P-channel and N-channel MOS transistors be increased while the threshold level voltage $V_{th}$ thereof be decreased. Those requirements result in an increase in dissipation of current. In addition, because the output impedance is constructed by active elements such as MOS transistors, the output impedance is greatly varied in accordance with input and output potential levels, power supply voltages, temperatures, etc.

FIG. 2 depicts interrelation among an input voltage $V_{in}$, an output voltage $V_{out}$, output impedance $R_{out}$, current $I_c$ flowing through P- and N-MOS transistors when supplied with a voltage $(V_{DD} - V_{SS})$, which occur within the CMOS analog amplifier of FIG. 1.

The graph (I) in FIG. 2 shows a $V_{in} - V_{out}$ characteristic of a conventional CMOS transistor, indicating that $V_{in}$ is biased at the substantially same as $V_{out}$ via the bias resistor $R_f$ and thus the CMOS operating center $V_{coc}$ is given. The graph (II) shows the dependency of the output impedance $R_{out}$ upon variations in the output voltage $V_{out}$, indicating that $R_{out}$ tends to take a maximum at the operating center $V_{coc}$ and reduce when the power supply potential approximates either $V_{DD}$ or $V_{SS}$. Analysis of the graph (II) also reveals the fact that a reduction in the power supply voltage $(V_{DD} - V_{SS})$ and a temperature rise permit the output impedance $R_{out}$ to be increased as suggested by the curves (1) and (2).

The graph (III) shows variations in the current $I_c$ flowing through the CMOS when supplied with $(V_{DD} - V_{SS})$, as a function of the input potential $V_{in}$. While the current $I_c$ has a peak at the operating center, the same is correspondingly reduced in accordance with a degree of deviation from the operating center $V_{coc}$.

FIG. 3 shows an example wherein the above discussed type of the amplifier is applied to timekeeping crystal oscillators whose frequency is about 32.768 KHz. A quarts oscillator is denoted as X and phase shifting or frequency adjustment capacitors are denoted as $C_1$ and $C_2$. In case where the crystal impedance value (hereinafter referred to as (I) of the quarts oscillator X is relatively small (typically, in the order of several tens KΩ), the crystal oscillator of FIG. 3 is satisfactory for practical use of timekeeping devices. The critical conditions for practical use of timekeeping devices are that regulation of oscillation frequency for power supply voltage $\Delta f/f \cdot V$ is below 1.0 sec/day.V, dissipation of current under voltage supply of 1.6V is below 5 μA, lowest oscillation initiating voltage is below 1.4V and oscillation initiating period is within 8 seconds.

However, if CI of the quartz oscillator X is increased beyond 100 KΩ, the circuit of FIG. 1 can fulfill these requirements no longer. In the event that CI is several hundred KΩ, oscillation itself will be very difficult. It is deemed that this is caused by the above disadvantages mentioned with respect to the CMOS analog amplifier of FIG. 1. In a characteristic diagram of FIG. 2, the difficulty in reducing the output impedance Romax in the vicinity of the operating center $V_{coc}$ means particularly that a period of time required for initiating oscillation is considerably longer because it is difficult to excite the quartz oscillator when initiating oscillation. In addition, the difficulty in reducing the average of the output impedance $R_{out}$ implies an increase in the oscillation initiating voltage.

The greater variations in the output impedance $R_{out}$ of the amplifier as a function of power voltage variations, the greater the regulation of the oscillation frequency. Although silver batteries recommended to solid state wristwatches can provide a comparatively stable discharge voltage when loaded with a light-load, their temperature dependencies vary from battery to battery to thereby affect adversely the performances of the oscillator.

When CI of the quartz oscillator is increased in this way, attenuation factor of a feed-back system inclusive of a phase shifter is correspondingly increased. As a consequence, the difficulty in initiating oscillation is still not avoided as far as the maximum and average of the output impedance $R_{out}$ of the amplifier remain unchanged and in other words are at high values. Accordingly, it is a primary object of the present invention to provide an improved amplifier suited for effectively exciting quartz oscillators of relatively high CI, which has advantageously comparatively high gain, comparatively low output impedance, minimized variations in output impedance, and minimized power dissipation.

BRIEF DESCRIPTION OF DRAWINGS

Other objects and novel features of the present invention are set forth in the appended claims and the present invention as to its organization and its mode of operation will best be understood from a consideration of the following detailed description of the preferred embodiments taken in connection with the accompanying drawings, wherein:

FIG. 13 is a circuit diagram of a resistor load MOS amplifier;

FIG. 14 is a graph showing operating characteristics of the amplifier of FIG. 13;

DETAILED DESCRIPTION OF INVENTION

Figure 4:
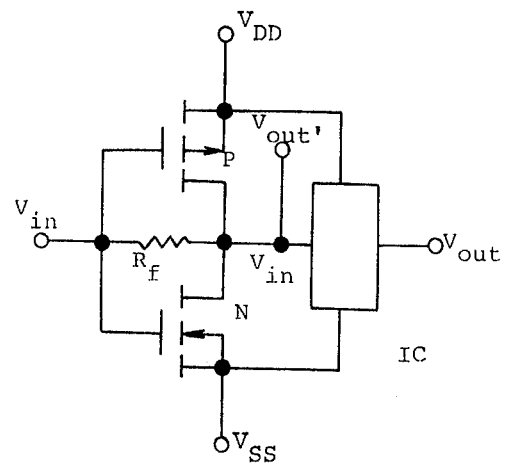
FIG. 4 is a circuit diagram of one preferred form of an analog amplifier constructed in accordance with the present invention.
Figure 5:
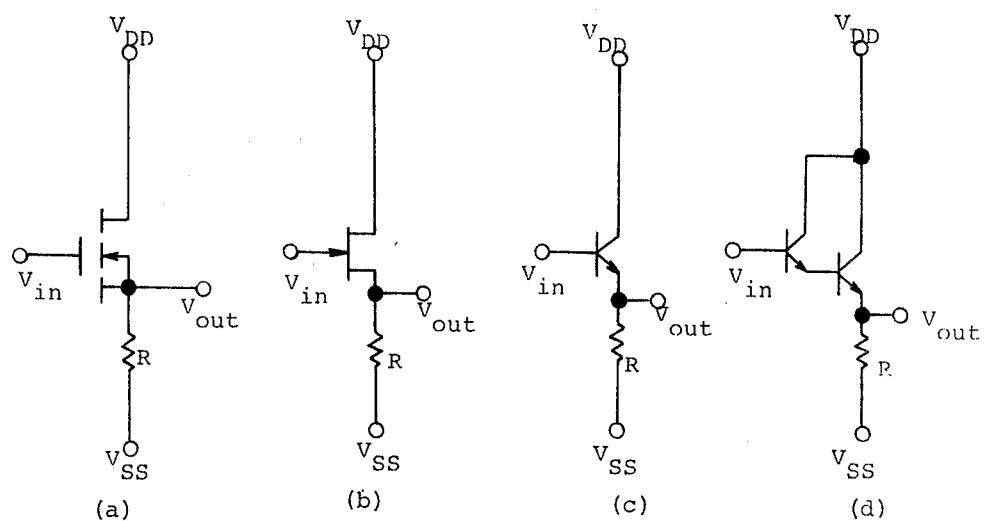
FIG. 5(a), 5(b), 5(c) and 5(d) are circuit diagrams of examples of the essential implementations of the circuit of FIG. 4.

Attention is initially called to FIG. 4 of the drawings which illustrates a basic construction of an amplifier embodying the present invention. A CMOS analog amplifier having high gain and low power consumption properties as briefly described above is provided at its output with an impedance converter IC which has generally a considerably higher input impedance and a considerably lower output impedance, for the purposes of reducing the output impedance of the CMOS analog amplifier. The resulting circuit arrangement assures low output impedance and low power consumption while keeping the high gain properties of the CMOS scheme.

The impedance converter IC may take a variety of forms some of which are shown in FIGS. 5(a) through 5(d).

In case where the basic circuit construction is in the form of CMOS as described above, a MOSFET follower as suggested in FIG. 5(a) is most beneficial because of its simplicity of integrated circuit manufacture. However, when taking only the functions of the impedance converter into account, a junction type FET of FIG. 5(b), bipolar transistors of FIGS. 5(c) and 5(d) may be equally applicable. In any case, since the output impedance of the CMOS analog amplifier is considerably high, it is recommended that the input impedance of the impedance converter IC is as high as possible. To this end, for the emitter follower of FIG. 5(c) β is as high as possible. In case of FIG. 5(d), Darlington Connection may be applied. Moreover, super-β transistors may be employed. Other elements may be employed as far as they do not interfere with the performances of the impedance converter. In case of FET's, P-channel or N-channel enhancement mode transistors or depletion mode transistors are optionally selectable. In case of bipolar transistors, either PNP type or NPN transistors may be useful.

In the examples of FIGS. 5(a) through 5(d) there is provided a resistor R as a passive element at their output portions. This follows that variations in the output impedance due to variations in power supply voltage and temperature are greatly reduced as compared with the circuit of FIG. 1 wherein the output impedance is established by only passive elements.

The output impedance itself may be optionally determined by the resistor R and gm of the transistors. However, in determining and more particularly reducing the output impedance, care must be taken not to increase current consumption.

Figure 6:
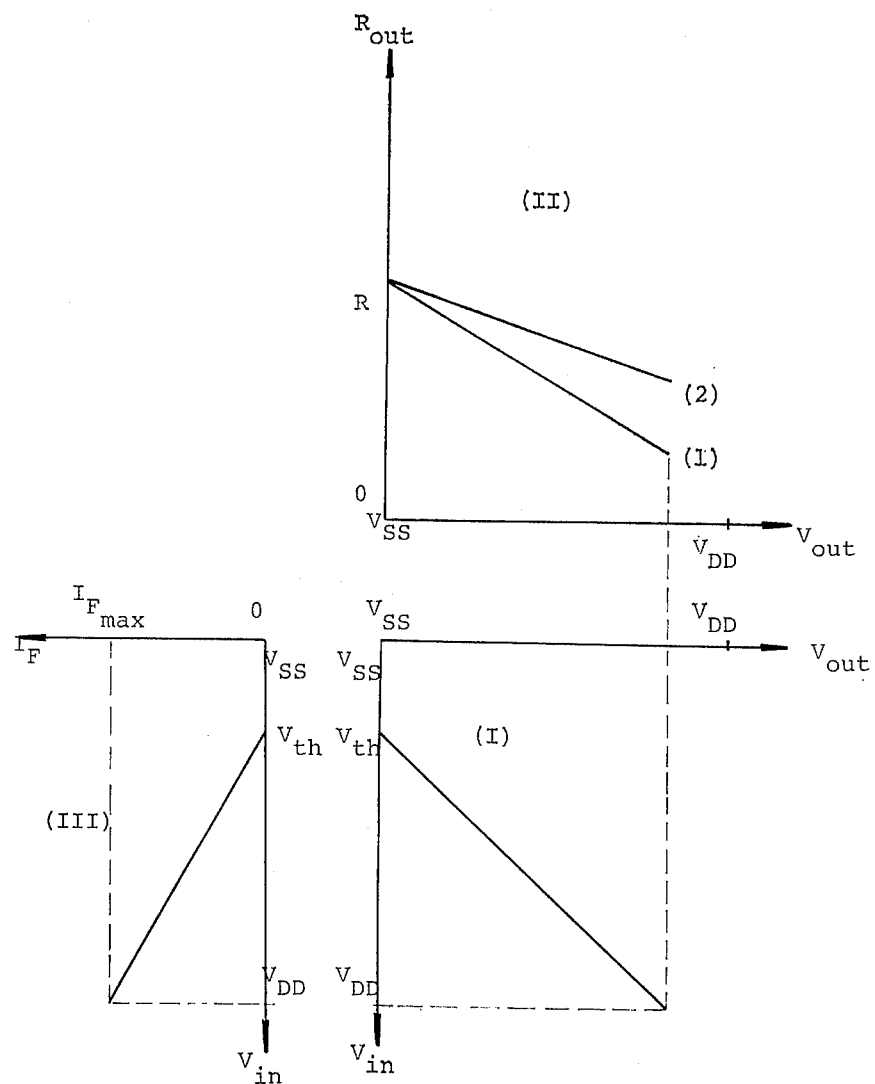
FIG. 6 is a graph showing operating characteristics of the example shown in FIG. 5(a)

FIG. 6 illustrates correlation among input voltage $V_{in}'$, output voltage $V_{out}$, output impedance $R_{out}$, current $I_f$ flowing through the MOSFET and the resistor R when supplied with power voltage $V_{DD} - V_{SS}$, etc.

The graph (I) shows $V_{in}'$ versus $V_{out}$ characteristic of a MOSFET follower. The presence of the threshold voltage $V_{th}$ inherent to the MOSFET's develops no output $V_{out}$ while the input $V_{in}'$ changes from $V_{ss}$ to $V_{th}$. The gain should not be more than 1 from the viewpoint of the operating principle of the follower amplifier. In other words, the maximum of the output $V_{out}$ never reaches $V_{DD}$ in contrast with the CMOS scheme.

The graph (II) indicates the development of the output impedance $R_{out}$ of the MOSFET follower as a function of variations in the output potential $V_{out}$. Since the MOSFET is in the pinch off state before the input $V_{in}'$ changes from $V_{ss}$ to $V_{th}$, the output impedance $R_{out}$ is the very output resistor R. As the input $V_{in}'$ exceeds the voltage $V_{th}$ and advances toward the voltage $V_{DD}$, the ON resistor of the MOSFET is correspondingly reduced, thereby accomplishing a reduction of the output impedance $R_{out}$.

Within the graph (II), the curve (1) represents the output impedance $R_{out}$ when power supply voltage $V_{DD} - V_{SS}$ and at room temperature, whereas the curve (2) represents the same when power supply voltage lower than $V_{DD} - V_{SS}$ and at a higher than room temperature. It will be clear from the curves that the output impedance in the case (2) is higher than in the case (1).

The graph (III) depicts the current $I_F$ flowing across the power terminals $V_{DD}$ and $V_{SS}$ of the MOSFET follower when supplied with $V_{DD} - V_{SS}$, as a function of the input potential $V_{in}'$. Since the MOSFET is in the pitch off state to permit little or no current $I_F$ till the input $V_{in}'$ reaches the voltage $V_{th}$. However, when the input $V_{in}'$ is increased beyond the voltage $V_{th}$ to approach the voltage $V_{DD}$, the ON resistor of the MOSFET is decreased and the current $I_F$ is increased.

Figure 7:
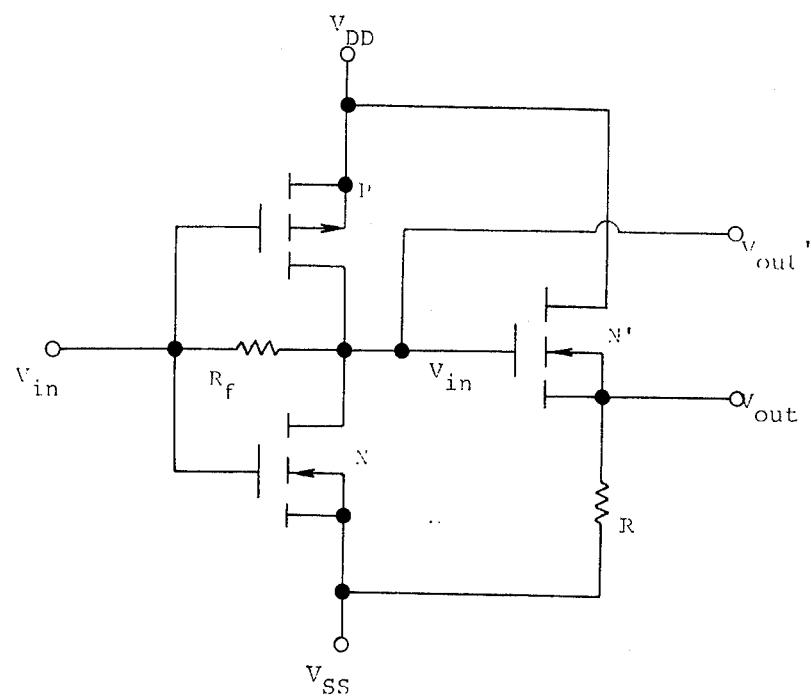
FIG. 7 is a circuit diagram of another preferred form of the present invention.

An amplifier arrangement which employs as a buffer means for the CMOS analog amplifier the MOSFET follower having the above discussed properties, is illustrated in FIG. 7. An N-channel MOSFET forming the follower circuit is denoted as N'. While the output terminal of the CMOS analog amplifier is commonly connected to the input terminal of the next succeeding stage MOS follower, both are respectively denoted as $V_{out}$, $V_{in}'$ for the sake of explanation only. A total of the consumption current $I_c$ of the CMOS analog amplifier and the consumption current $I_F$ of the MOS follower is denoted as $I_T$.

Figure 2:
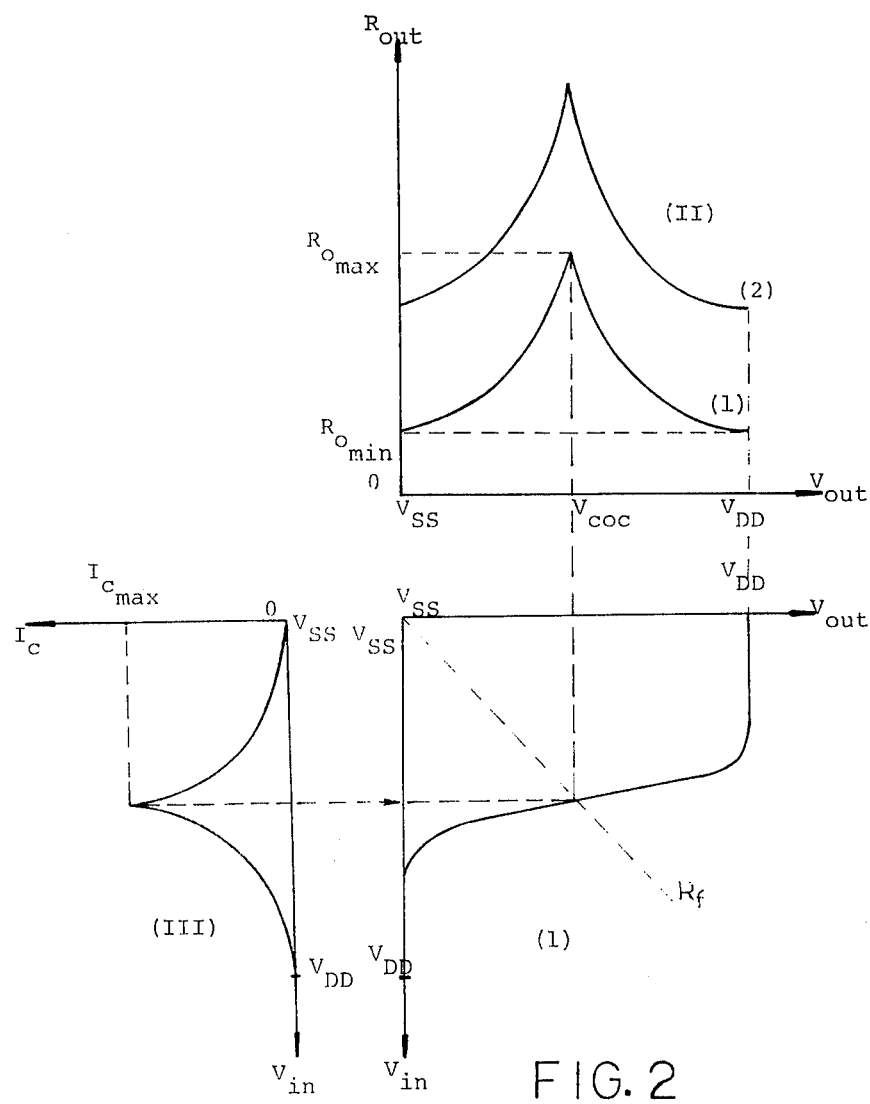
FIG. 2 is a graph showing the operating characteristics of the analog amplifier of FIG. 1.
Figure 8:
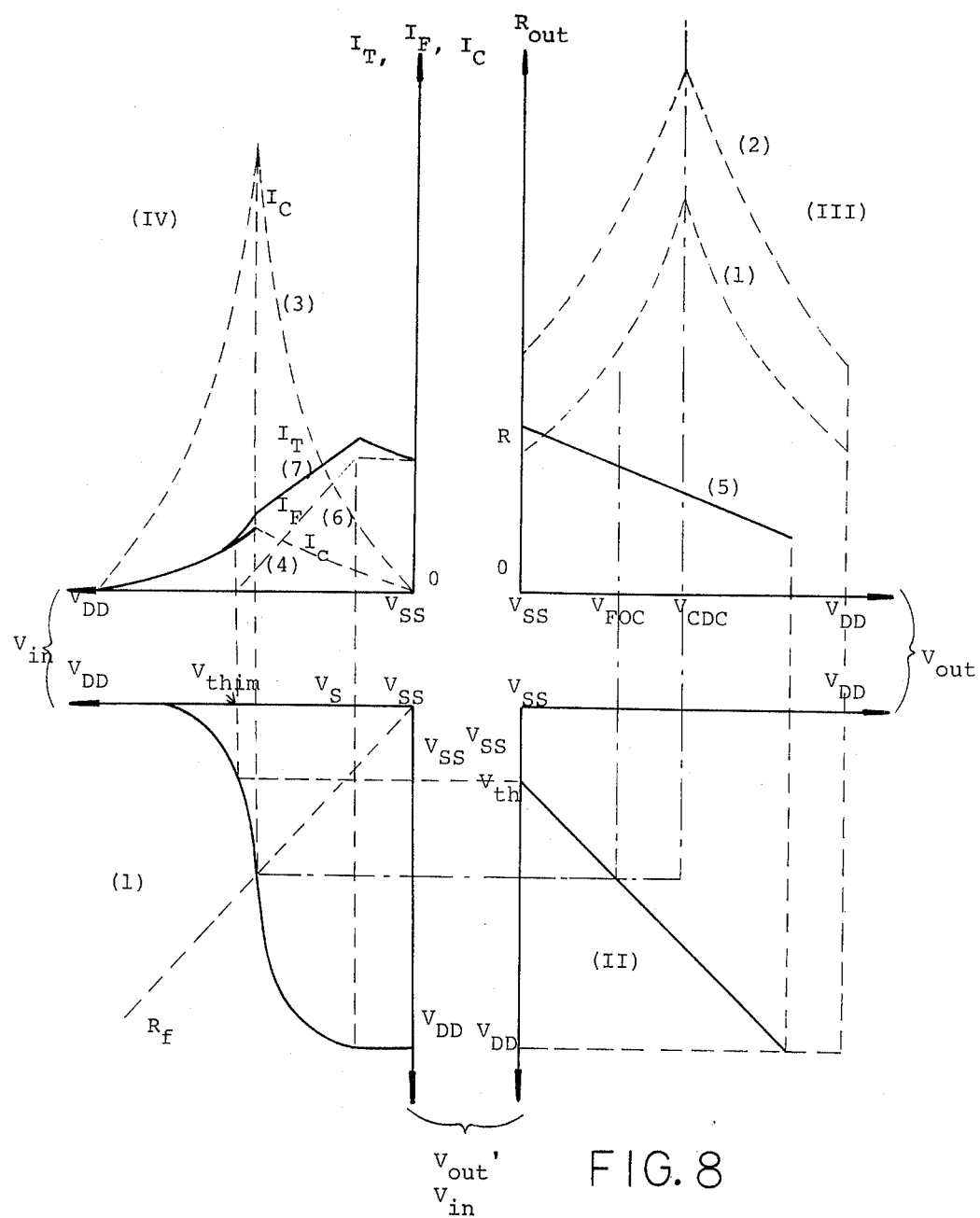
FIG. 8 is a graph showing operating characteristics of the circuit of FIG. 7 for illustration of operation.

FIG. 8 illustrates some of the operating characteristics of the CMOS analog amplifier. The graph (I) depicts relationship between the input potential $V_{in}$ and the output potential $V_{out}'$; the graph (II) depicts relationship between the input potential $V_{in}'$ and the output potential $V_{out}$ within the MOS follower; the graph (III) depicts relationship between the output potential $V_{out}$ and the output impedance $R_{out}$; and the graph (IV) depicts relationship between the input potential $V_{in}$ and the consumption current $I_c$ and $I_F$ and the total consumption current $I_T$. These graphs are provided for comparison between the basic CMOS amplifier of FIG. 2 and the MOSFET follower of FIG. 6.

It is obvious from relationship between the curve (I) in the graph (III) and the curve (3) in the graph (IV) and relationship between the curve (2) in the graph (III) and the curve (4) in the graph (IV) that intention to reduce the output impedance $R_{out}$ leads an increase in the consumption current $I_c$.

Analysis of the curve (5) in the graph (III) reveals that the output impedance $R_{out}$ always stands below the resistance value of the output resistor R for all of the possible output potentials by employment of the MOS follower driver. While the output voltage is biased with the operating center $V_{FOC}$ of the MOS follower output, the peak of the output impedance $R_{out}$ does not stand in the vicinity of the operating center $V_{FOC}$ in contrast with the basic CMOS amplifier.

Accordingly, the circuit of FIG. 7 is effective in a field wherein the output impedance $R_{out}$ at the operating center should be low.

Figures 1, 3:
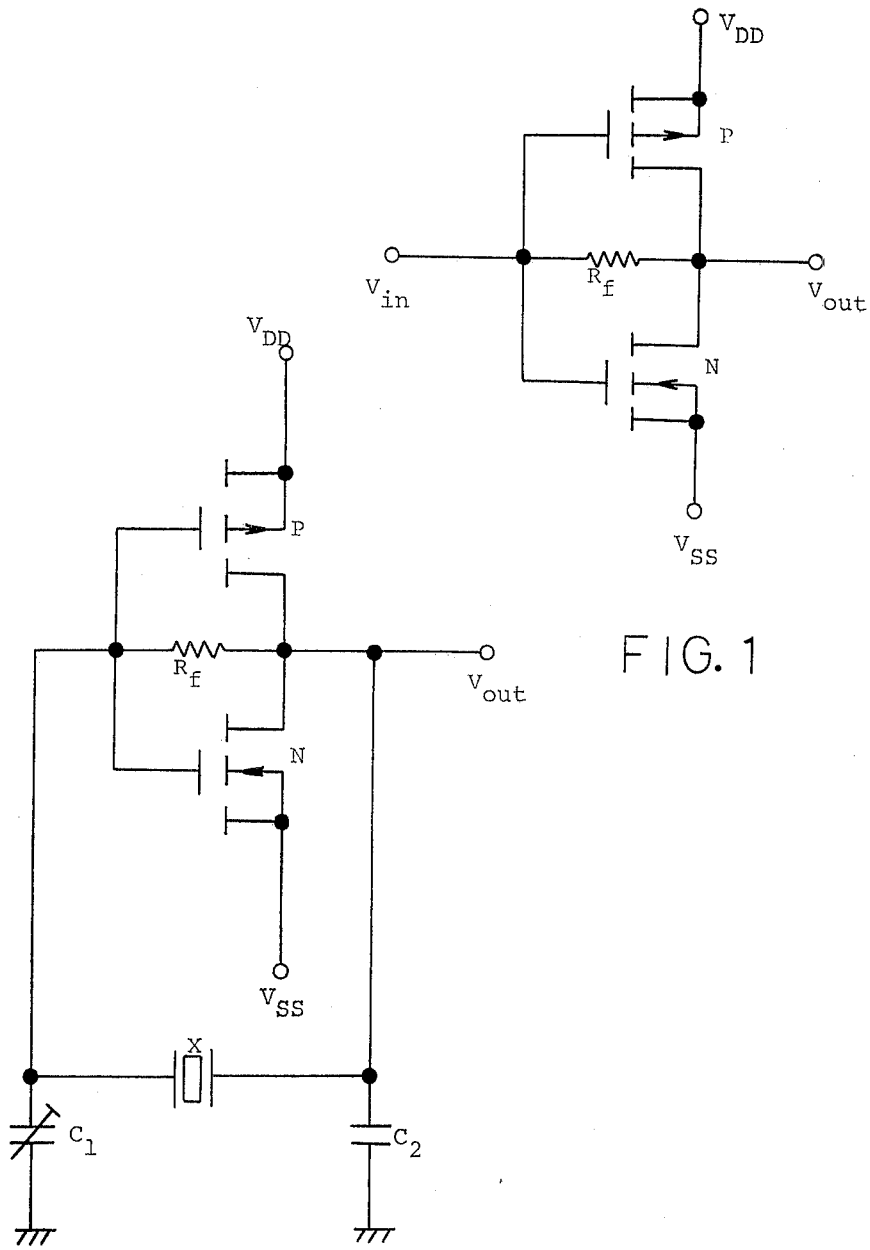
FIG. 1 is a circuit diagram of a prior art CMOS analog amplifier.
FIG. 3 is a circuit diagram of an example of applications of the analog amplifier of FIG. 1.

As stated earlier, in case of the basic CMOS amplifier of FIG. 1, the only way to reduce the output impedance is to increase gm of the P- and N-MOS transistors or to decrease $V_{th}$. This results in an increase in consumption current. However, since pursuant to the circuit of FIG. 7 the output of the CMOS analog amplifier is utilized only to drive gate capacitor of the next succeeding state MOS follower, the output impedance of the CMOS amplifier may be so sufficiently high as not to disturb the frequency characteristic thereof. For example, the characteristics as suggested by the curve (2) of the graph (III) and the curve (4) of the graph (IV) may be employed. In other words, it is easy not to decline the voltage gain even if P- and N-MOS transistors within the CMOS scheme assume smaller gm. This enables the consumption current $I_c$ in the CMOS amplifier region to be largely reduced.

Moreover, since the circuit of FIG. 7 is such that the output impedance $R_{out}$ is established by the MOS follower including one passive element (that is, the resistor R; a factor of causing variations in its resistance is only temperature) but excluding one active element (that is, the MOS transistor), the output impedance $R_{out}$ of the MOS follower circuit is scarcely varied due to variations in the input and output potentials, the power supply voltage, temperature, etc.

The following sets forth the consumption current $I_F$ in the MOS follower circuit. The curve (6) in the graph (IV) of FIG. 8 illustrates changes in the consumption current $I_F$ in the MOS follower circuit as a function of changes in the input potential $V_{in}$. No current $I_F$ flows till the input potential $V_{in}'$ is increased from $V_{SS}$ to $V_{th}$. As $V_{in}'$ approaches $V_{DD}$ through $V_{th}$, $I_F$ is increased. When $V_{DD}$ is exceeded, $I_F$ takes a maximum.

A voltage $V_s$ means the input voltage $V_{in}$ of the CMOS amplifier sufficient to permit the output voltage $V_{out}$, of the CMOS amplifier to continue saturating at the voltage $V_{DD}$. A voltage $V_{thin}$ means the input voltage $V_{in}$ of the CMOS amplifier sufficient to permit the input potential $V_{in}'$ of the MOS follower to reach the voltage $V_{th}$.

No current $I_F$ will flow during a period of time where the input voltage $V_{in}$ is between the voltage $V_{DD}$ and the voltage $V_{thin}$.

The current $I_F$ is increased as the voltage changes from the voltage $V_{thin}$ to the voltage $V_s$. But, $I_F$ becomes fixed during transition from $V_s$ to $V_{SS}$. If variations in the consumption current $I_c$ responsive to variations in the input voltage $V_{in}$ are assumed to describe the curve (4) in the graph (IV) of FIG. 8, the total consumption current $I_T$ will $I_F + I_c$ as viewed from the curve (7).

Since in the circuit of FIG. 7 it is possible to stretch the output $V_{out}'$ with accompanying relatively good linearity and relatively good amplitude characteristic. The output $V_{out}'$ is, therefore, useful when driving a light-load.

Figure 9:
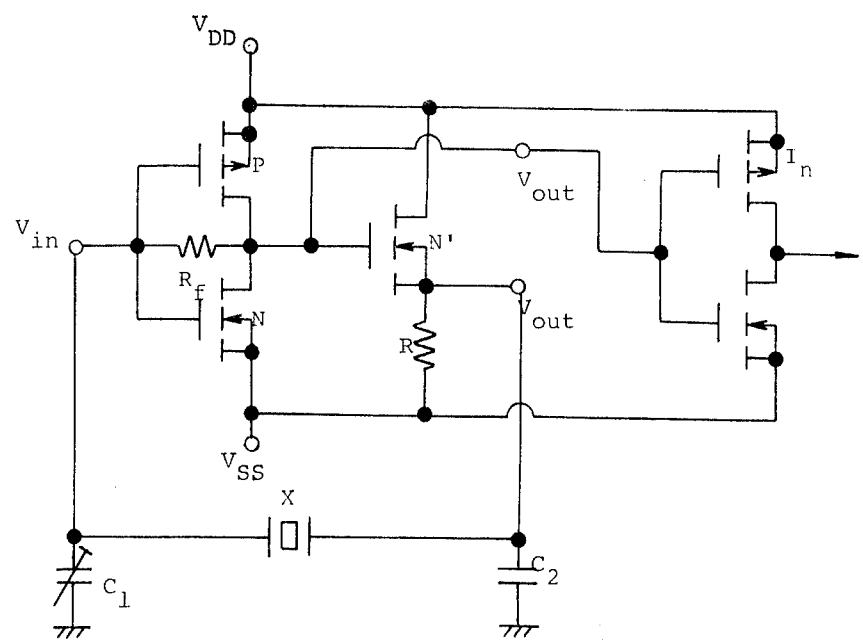
FIG. 9 is a circuit diagram of an example of application of the present invention.

Accordingly, when the amplifier embodying the present invention is combined with quartz oscillators of higher CI in crystal oscillators for solid state timekeeping devices, the amplifier gives excellent oscillation characteristics. More particularly, it is possible to reduce the oscillation initiating duration, the oscillation initiating voltage and oscillating frequency deviation and power consumption. In addition, signals of large amplitude are obtainable through the utilization of the output terminal $V_{out}'$ to assure a simplicity in a next succeeding stage pulse re-shaping circuit. FIG. 9 is an example wherein excitation of the crystal oscillator having requirement for lowered output impedance is through the output $V_{out}$ of the MOS follower and signal stretching is through the output $V_{out}'$ of the CMOS amplifier. The output is re-shaped easily by introduction into a CMOS re-shaping circuit $I_n$.

An example of practical conditions is as follows: the MOS transistor N' within the MOS follower amplifier is an N-channel one wherein $\beta \approx 400 \mu$ /V and $V$th $= 0.7$ V at 1 $\mu$A; the resistor R is 470 K$\Omega$; the quartz oscillator X has nominal oscillation frequency of 32.768 KHz; CI is 265 K$\Omega$; capacitors $C_1$ and $C_2$ are respectively 19 pF and 81 pF. When $V_{DD} - V_{SS} = 1.6$V and room temperature 25° C, $I_F = 1.35$ $\mu$A, $I_c = 1.95$ $\mu$A, $I_F = 3.20$ $\mu$A, the oscillation initiating duration = 6 sec., the minimum oscillation initiating voltage and oscillation frequency deviation against power voltage variations is 0.8 sec/day V. These results are completely satisfactory to timekeeping crystal oscillators.

Figure 10:
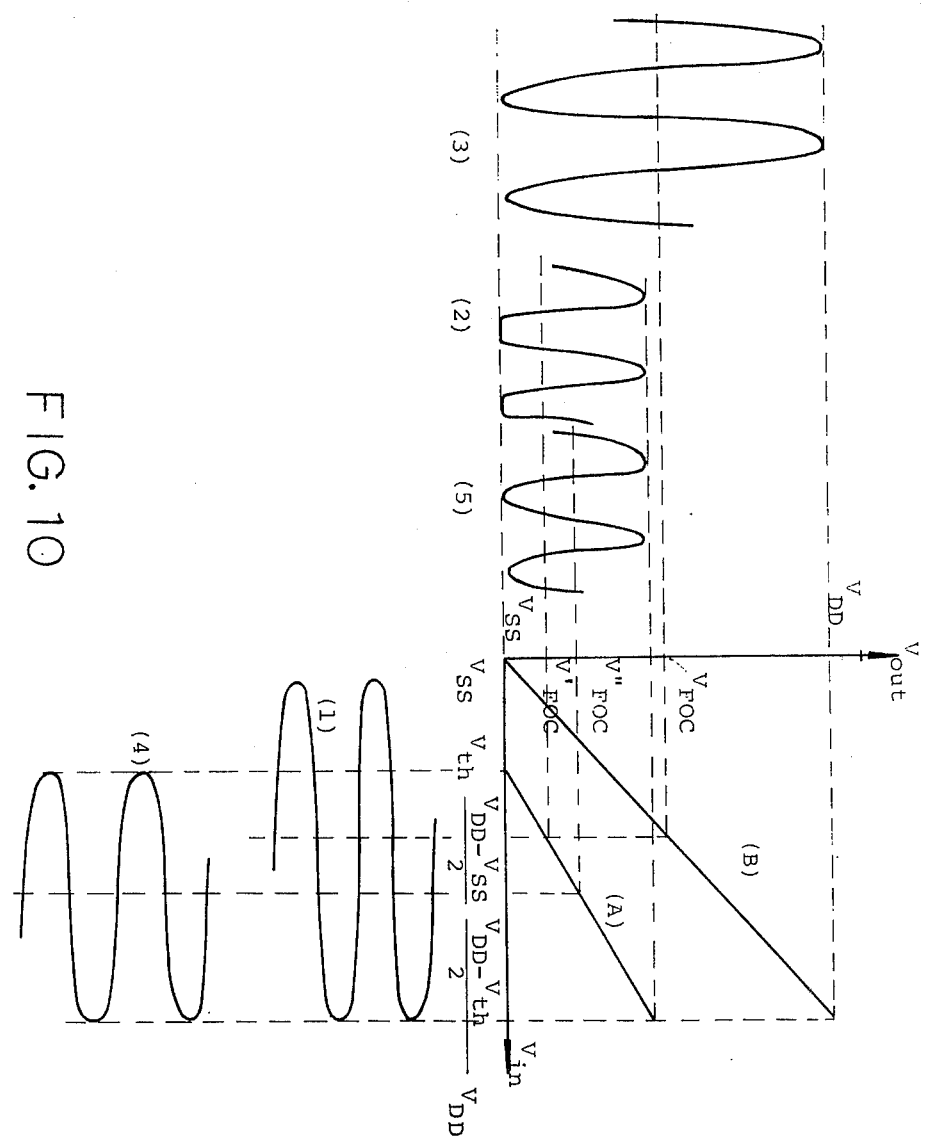
FIG. 10 is a graph showing operating characteristics of the embodiment of FIG. 7.
Figure 11:
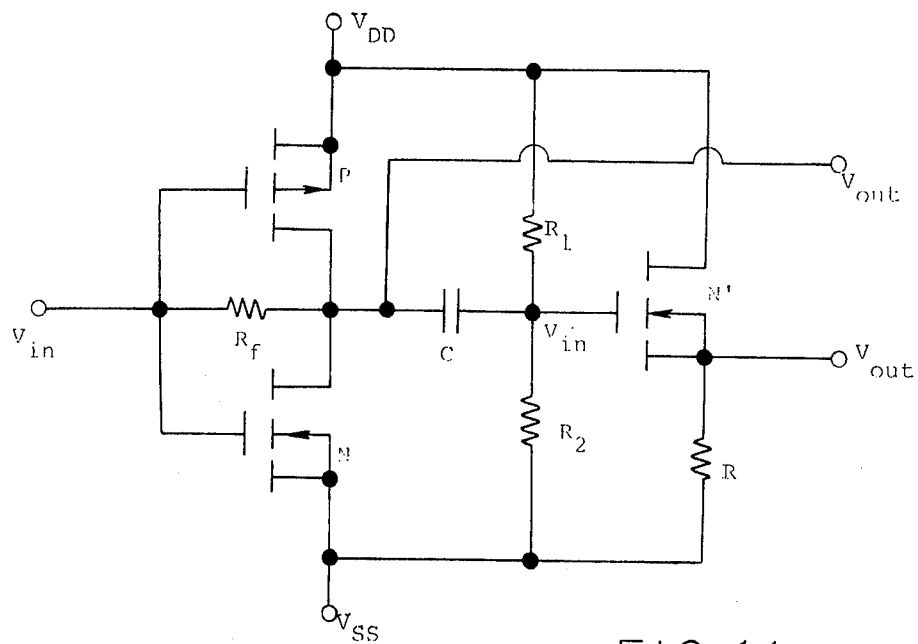
FIG. 11 is a circuit diagram of still another preferred form of the present invention.

For comparison purposes, if the quartz oscillator is excited by the CMOS amplifier without using the MOS follower, the following unfavorable results are given: the consumption current is 5.8 $\mu$A; the oscillation initiating duration is over 40 sec.; the oscillation initiating voltage is 1.6V; the frequency deviation is 2.5 sec/day V. Input-output waveform characteristics of the MOS follower stage when biased via the $R_f$ are illustrated in FIG. 10, wherein the curve (A) represents relationship between the follower input voltage $V_{in}'$ and the follower output voltage $V_{out}$ in case where the threshold voltage $V_{th}$ of the MOS transistor N' of FIG. 7 can not be ignored as compared with the power supply voltage $V_{DD} - V_{SS}$. The curve (B) is viewed in case where the threshold voltage $V_{th}$ is extremely low as compared with the power voltage $V_{DD} - V_{SS}$ or zero. For the MOS follower having the characteristics shown by the curve (A), the operating center of the output $V_{out}$ is $V_{FOC}'$ when the input of the MOS follower is biased with the voltage ($V_{DD} - V_{SS}/2$) via $R_f$ within the CMOS amplifier. When the input $V_{in}'$ takes the signal waveform (1), the output $V_{out}$ will take the somewhat disturbed waveform (2). For the MOS follower having the characteristic shown by the curve (B), the waveform of the output $V_{out}$ contains little distortion. As a matter of fact, the MOS follower as shown by the curve (B) intends to increase the consumption current. Meanwhile, when large amplitude is not necessary but waveform distortion is small, the CMOS amplifier and the MOS follower are AC coupled through a capacitor C as suggested in FIG. 11. By a couple of resistors $R_1$ and $R_2$, the source follower input $V_{in}'$ is biased with ($V_{DD} - V_{th}/2$) to attain the waveform (5) containing little distortion. In this instance $V_{out}$ has the operating center $V_{FOC}''$.

Figure 12:
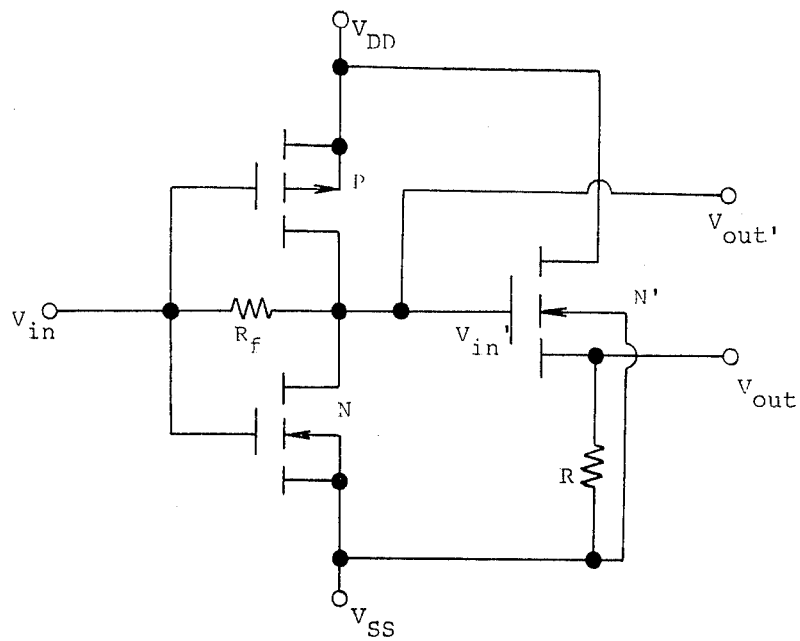
FIG. 12 is a circuit diagram of another preferred form of the present invention.

As shown in FIG. 12, current limiting effects are expected if a substrate potential is declined to $V_{ss}$ and voltage drop is developed between a substrate and a source due to the resistor R. The consumption current is therefore reduced even though the resistor R is not high.

Another approach to reduce and stabilize the output impedance without a considerable large reduction in the consumption current is suggested in FIG. 13 showing employment of a resistor-load MOS amplifier.

FIG. 14 illustrates the output potential $V_{out}$, the output impedance $R_{out}$, the current $I_L$ flowing through N-channel MOS transistor N and the resistor R, etc., as a function of the input potential $V_{in}$.

The graph (I) in FIG. 14 represents the $V_{in} - V_{out}$ characteristics of the resistor-load amplifier. Due to the presence of the threshold voltage $V_{th}$ inherent to the MOS transistors, the output potential $V_{out}$ remains unchanged at $V_{DD}$ till the input potential $V_{in}$ changes from $V_{ss}$ to $V_{th}$. However, during voltage transition from $V_{th}$ to $V_{IS}$ the output potential $V_{out}$ is greatly varied from $V_{DD}$ to $V_{OS}$. As well, during transition from $V_{IS}$ to $V_{DD}$ the output potential $V_{out}$ is held at the saturated value $V_{OS}$.

The graph (II) shows the development of the output impedance $R_{out}$ as a function of variations in the output potential $V_{out}$. When the input potential $V_{in}$ changes from $V_{ss}$ to $V_{in}$, the MOS transistor is held at the pinch off state and therefore the output impedance $V_{out}$ is constituted by only the output resistor R. As the input potential $V_{in}$ is increased via $V_{th}$ to $V_{IS}$, the on resistor of the MOS transistor is correspondingly reduced with an accompany gradual reduction in the output impedance $R_{out}$. The output potential $V_{out}$ is held at the saturated state $V_{OS}$ till the input potential $V_{in}$ is varied from $V_{IS}$ to $V_{DD}$. Thus, the output impedance $R_{out}$ becomes unchanged. The curve (1) in the graph (II) shows the output impedance $R_{out}$ under the power supply voltage $V_{DD} - V_{SS}$ and at room temperature, whereas the curve (2) shows the same under the conditions where the power supply voltage is lower than $V_{DD} - V_{SS}$ and the circumambient temperature is higher than room temperature.

The graph (III) shows the current $I_L$ flowing across the power supply terminals $V_{DD}$ and $V_{SS}$ of the resistor-load MOS amplifier when supplied with $V_{DD} - V_{SS}$, as a function of the input potential $V_{in}$. Since the MOS transistor is at the pinch off state when the input potential $V_{in}$ is varied from $V_{SS}$ to $V_{th}$, no current $I_L$ flows. But, as the input potential $V_{in}$ is increased via $V_{th}$ to $V_{IS}$, the ON resistor of the MOS transistor is reduced to thereby increase the current $I_L$. If $V_{IS}$ is exceeded, the current $I_L$ is saturated at $I_{LS}$.

As noted earlier, the amplifier of FIG. 13 supplies current through the load resistor R when its active elements are at the ON state. The output impedance $R_{out}$ is formed by the constant resistor R and the MOS transistor N. The number of the MOS transistors as the active elements is reduced from two to one such that variations in the output impedance $R_{out}$ due to the input and output voltage levels, the power supply voltage and the temperature are further minimized.

Figure 15:
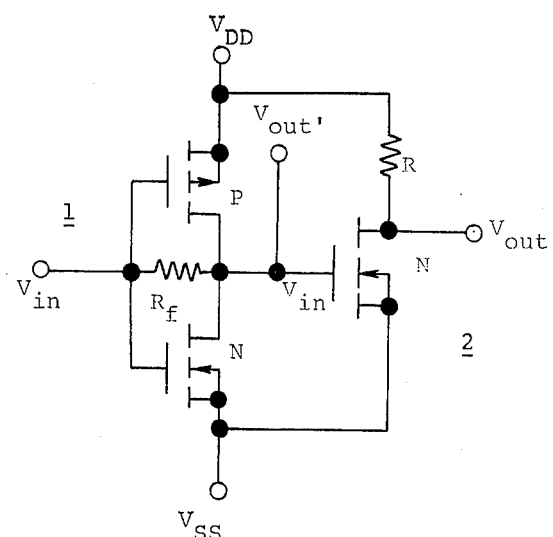
FIG. 15 is a circuit diagram of one preferred form of the present invention utilizing the resistor-loaded MOS amplifier.

FIG. 15 is one preferred form of the present invention which is predicated upon a combination of the complementarily coupled transistor amplifier and the above discussed resistor-load transistor amplifier; in accordance with the former amplifier, while the output impedance is relatively high and its variations due to the input and output levels and the power supply voltage are relatively large, the voltage gain is high and the input impedance is high; in accordance with the latter amplifier, as described with respect to FIGS. 13 and 14, the input impedance is high but the output impedance is relatively low and its variations due to the input and output levels and the power supply voltage also is relatively low.

The embodiment of FIG. 15 comprises a CMOS amplifier 1 including a P-channel MOS transistor P, an N-channel MOS amplifier N and a bias resistor $R_f$ provided between its input and output, and a resistor-load MOS amplifier 2 of which the load resistor R is is connected to the drain of the N-channel MOS transistor N, the output node of the CMOS amplifier 1 being connected to the input node of the resistor-load MOS amplifier 2. With such an arrangement, the input node of the resistor-load MOS amplifier 2 is biased.

Figure 16:
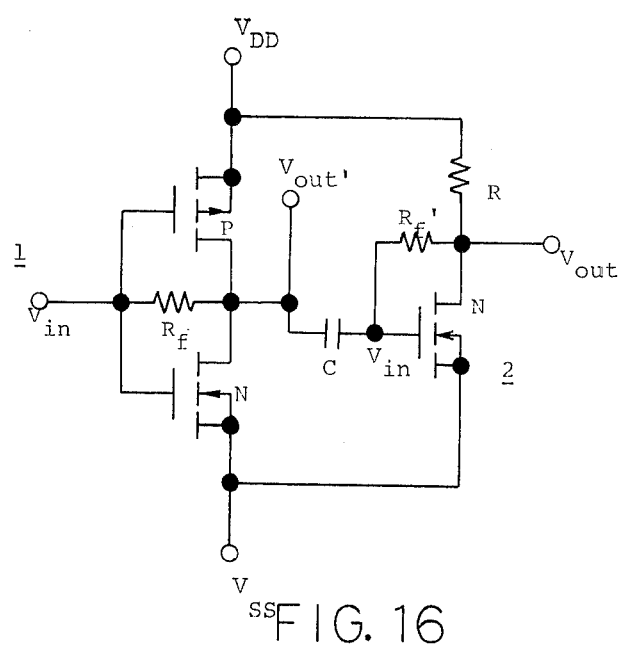
FIG. 16 is a circuit diagram of another preferred form of the present invention utilizing the resistor-loaded MOS amplifier.

In case where DC amplification is not needed and variations in the bias level at the input node of the resistor-load amplifier should be minimized, DC level is cut via a capacitor C and a resistor $R_f'$ establishes self biasing as suggested in FIG. 16.

Figure 17:
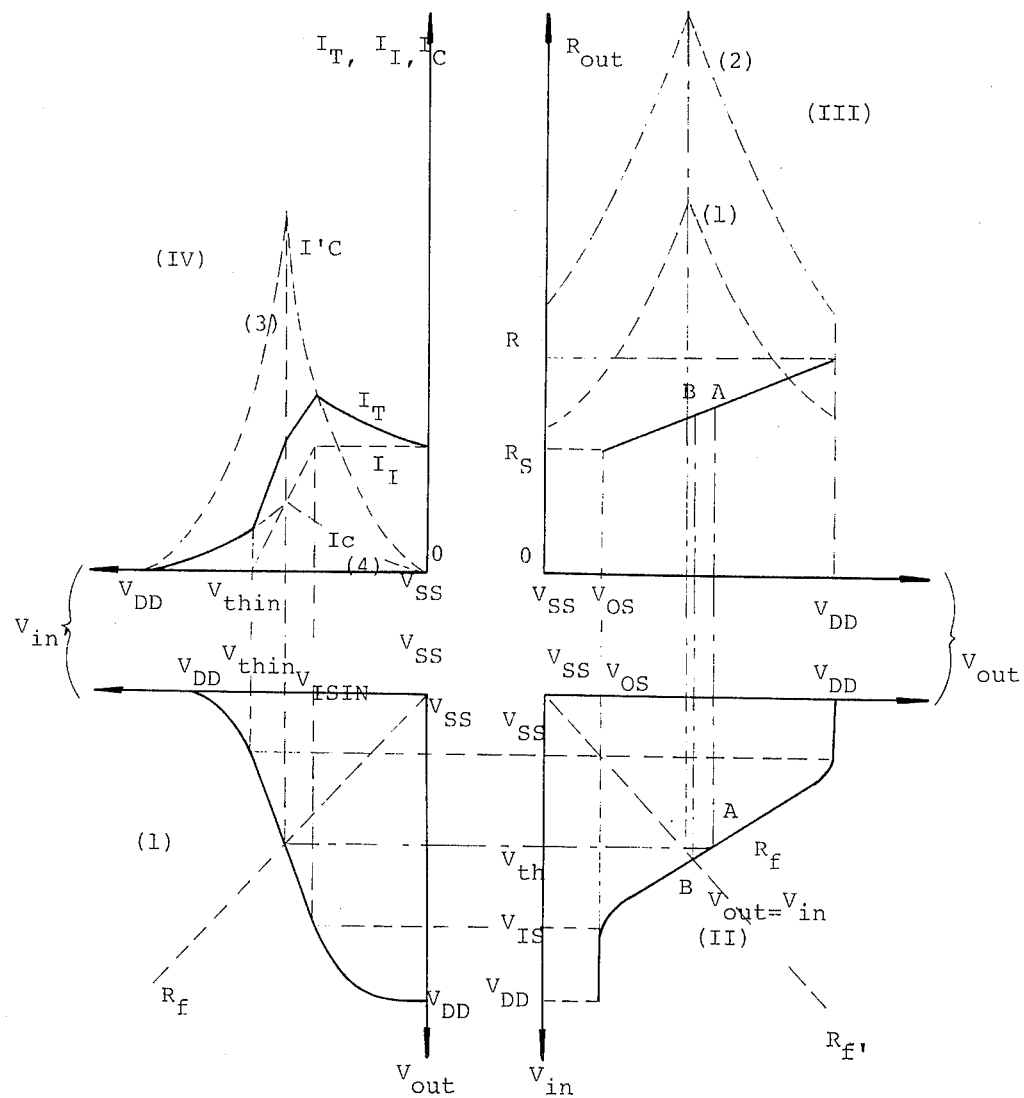
FIG. 17 is a graph of characteristic curves for the purpose of illustration of operation of the embodiments of FIGS. 15 and 16.

FIG. 17 illustrates various characteristics for the purpose of explanation of operation of the circuits shown in FIGS. 15 and 16. In FIG. 17, the graph (I) represents relationship between the input potential $V_{in}'$ and the output potential $V_{out}'$ within the CMOS amplifier 1; the graph (II) represents relationship between the input potential $V_{in}$ and the output potential $V_{out}$ within the resistor-load MOS amplifier 2; the graph (III) represents relationship between the output potential $V_{out}$ and the output impedance $R_{out}$; and the graph (IV) represents relationship between the input potential $V_{in}$ in the CMOS amplifier 1 and the consumption current $I_c$ in the CMOS amplifier 1, the counterpart $I_I$ in the resistor-load amplifier 2 and the sum thereof $I_T (= I_c + I_I)$. It is obvious from relationship between the curve (1) in the graph (III) and the curve (3) in the graph (IV) and relationship between the curve (2) in the graph (III) and the curve (4) in the graph (IV) that the consumption circuits $I_c$ and $I_c'$ are unavoidably increased if the output impedance $R_{out}$ is sought to be reduced.

It will be noted that the operating center of the resistor-load MOS amplifier 1 is somewhat shifted depending upon whether the DC coupling of FIG. 15 or the AC coupling of FIG. 16 is employed. Such fact is depicted on the graphs (II) and (III) in FIG. 17. A shows the operating center in case of the DC coupling while B shows the same in case of the AC coupling.

As illustrated in the graph (I) in FIG. 17, the output potential $V_{out}$ and the output impedance $R_{out}$ are constant till the input potential $V_{in}'$ is varied from $V_{DD}$ to $V_{thin}$. Under the circumstances the consumption current $I_I$ of the resistor-load MOS amplifier 2 is zero and hence the total consumption current $I_T$ is only the consumption current $I_c$ of the CMOS amplifier.

Therefore, as viewed from the graphs (II) and (III), the output potential $V_{out}$ is approximately equal to $V_{OS}$ and the output impedance $R_{out}$ is gradually decreased to the resistance $R_S$ during the period where the input $V_{in}'$ is advanced from $V_{thin}$ toward $V_{ISN}$. Simultaneously, the consumption current $I_I$ and in other words $I_T$ are increased.

During a period where $V_{in}'$ is varied from $V_{ISIN}$ to $V_{SS}$ the resistor-load MOS amplifier 2 is saturated so that the output potential $V_{out}$ and the output impedance $R_{out}$ are substantially settled at $V_{OS}$ and $R_S$. The consumption current $I_I$ becomes constant and the consumption current $I_C$ is gradually reduced, thereby reducing the total of the consumption current $I_T$.

Figure 18:
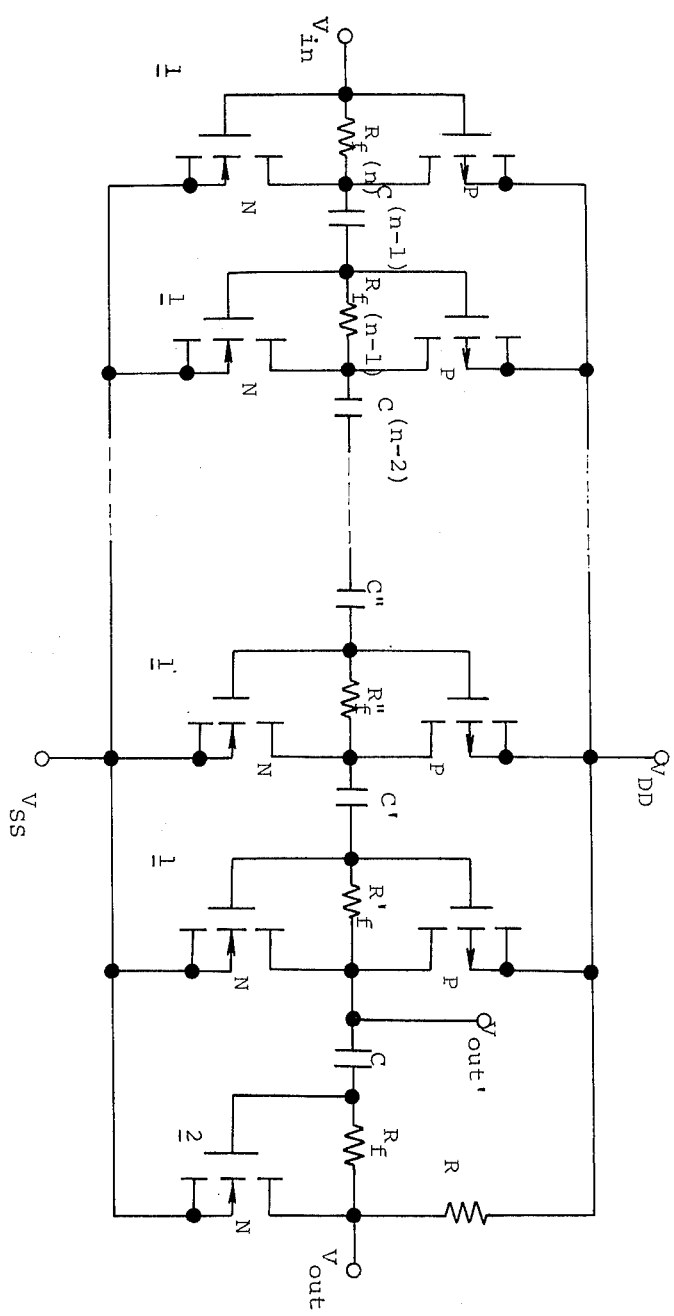
FIG. 18 is a circuit diagram of a multi-stage amplifier utilizing the portion of the circuit of FIG. 16.

As suggested in FIG. 18, the CMOS amplifier 1 may be provided in a multi-stage fashion. In case where the number of the amplifier stages is an even number, inversion is developed between the input $V_{in}$ and the output $V_{out}$. In the given example, the respective ones of the CMOS amplifiers are AC coupled via a series of capacitors C, C', ... C (n-1).

Figure 19:
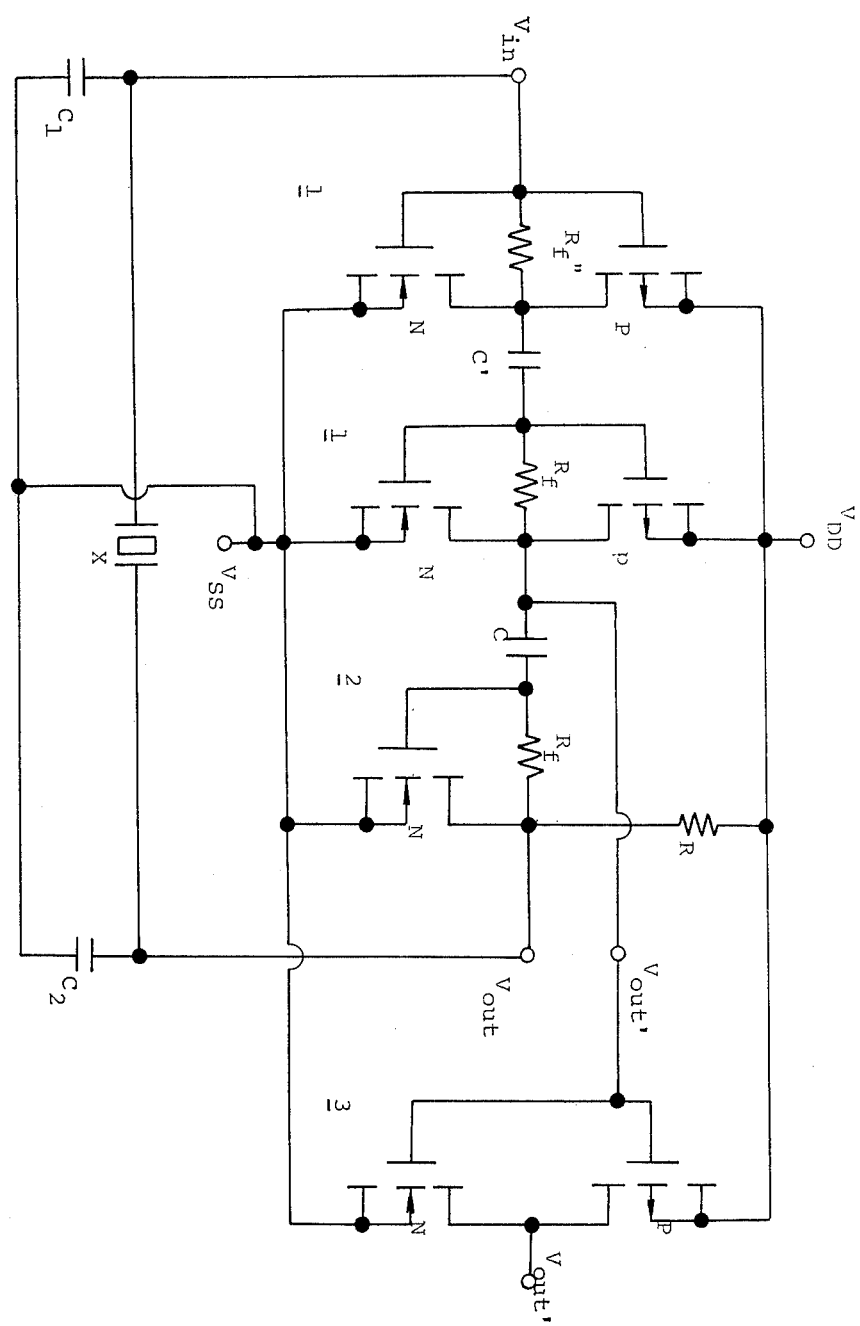
FIG. 19 is a circuit diagram of an oscillator utilizing the multi-stage amplifier of FIG. 18.

In FIG. 19, a two-stage CMOS amplifier 1 is provided and the output $V_{out}$ of the resistor-load MOS amplifier 2 is employed to excite the quartz oscillator X.

Figure 20:
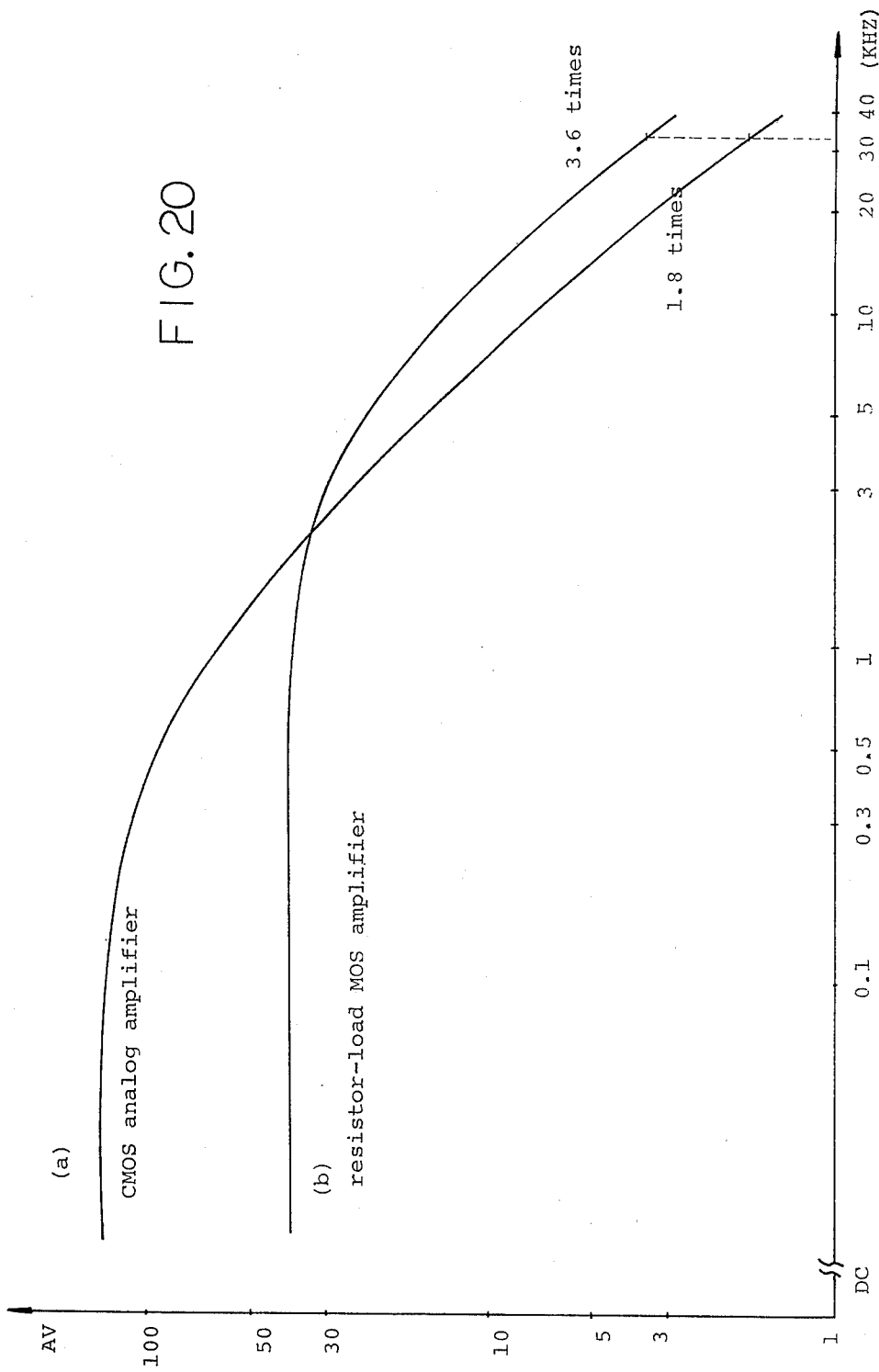
FIG. 20 is a graph showing frequency characteristic of the amplifier of FIG. 9.

Attention must be paid to the frequency characteristics of the respective amplifiers. In FIG. 20, (a) represents the frequency characteristic of the CMOS amplifier and (b) represents the counterpart of the resistor-load amplifier, wherein the input signal is 10 mVp-p, the voltage supply is 3.0V and the output floating capacitance is 8 pF.

In the case of the CMOS amplifier, the voltage gain is about 130 at a low frequency range but only 1.8 in the vicinity of the oscillating frequency of the quartz oscillator X (i.e., 32.768 KHz). In contrast to this, for the resistor-load amplifier the voltage gain is about 40 at a low frequency range and about 3.6 in the vicinity of the oscillating frequency 32.768 KHz. The resistor-load amplifier, therefore, manifests the better frequency characteristics although the current consumption is equal. Furthermore, since the gain within the DC and low frequency region is lower for the resistor-load amplifier, a multi-stage arrangement of the resistor-load amplifier is possible in principle.

Figure 21:
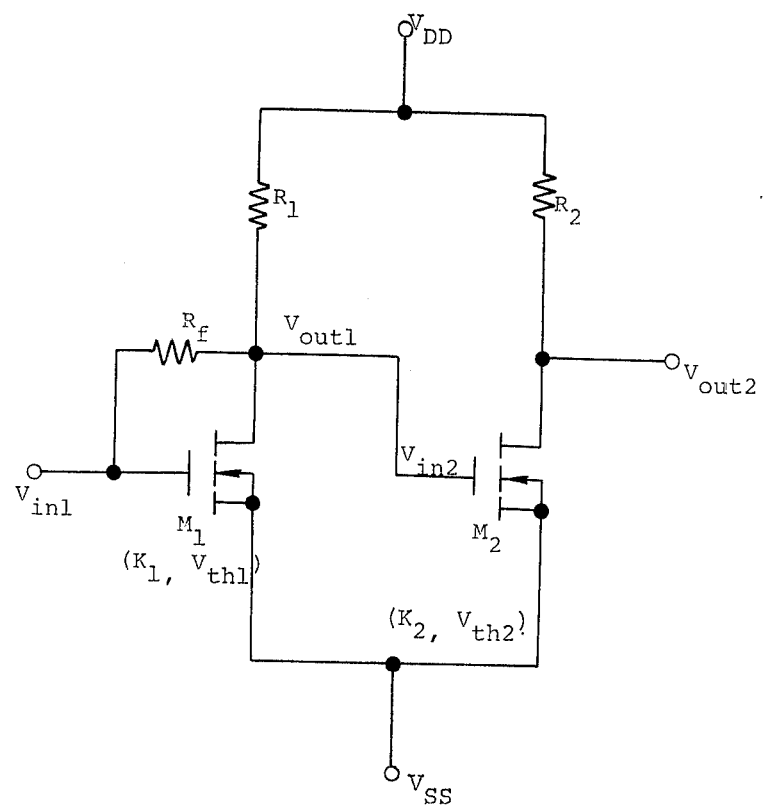
FIG. 21 is a circuit diagram of one preferred form of the present invention effective to improve the frequency characteristic of FIG. 20.

FIG. 21 is an example of a two-stage direct coupling resistor-load amplifier. Detailed analysis of the bias characteristics of the resistor-load amplifier of FIG. 21 is as follows.

Biasing is basically accomplished by the resistor $R_f$ provided between the drain and the gate of the first stage MOS transistor $M_1$. Therefore, when the input and output potentials of the transistor $M_1$ are respectively $V_{in1}$ and $V_{out1}$.

$$V_{out1} = V_{in1} \quad (1)$$

If the threshold voltage of the first stage MOS transistor $M_1$ is $V_{th1}$, $V_{th1} > 0$.

$$V_{out1} > V_{in1} - V_{th1} \quad (2)$$

This shows the fact that the MOS transistor $M_1$ is in the saturated state. Therefore, current $i_{DS}$ flowing through the MOS transistor is as follows.

$$i_{DS} = k_1(V_{in1} - V_{th1})^2 = k_{1'} \cdot W/L (V_{in1} - V_{th1})^2 = \mu\epsilon ox/2tox \cdot W/L (V_{in1} - V_{th1})^2 \quad (3)$$

If current flowing through the load resistor $R_1$ is $i_L$, $$i_L = (V_{DD} - V_{out1}/R_1) \quad (4)$$

Because of the next succeeding state being a MOS gate load, no DC current flows.

$$i_{DS} = i_L \quad (5)$$

The equations (3) and (4) are substituted into the equation (5).

$$V_{out} = V_{DD} - k_1 R_1 (V_{in1} - V_{th1})^2 \quad (6)$$

The equation (1) is substituted into the above.

$$K_1 R_1 V_{out1}^2 + (1 - 2K_1 R_1 V_{th1}) V_{out1} + K_1 R_1 V_{th1}^2 - V_{DD} = 0 \quad (7)$$

That is, $$V_{out1} = V_{th1} + \frac{\sqrt{1 + 4K_1 R_1 (V_{DD} - V_{th1})} - 1}{2K_1 R_1} \quad (8)$$
$$= V_{in1}$$

In this manner, the first stage amplifier biased via the bias resistor $R_f$ provides the output potential which is determined by $V_{th1}$ of the MOS transistor $M_1$, $K_1$, the load resistor $R_1$ and the power supply voltage $V_{DD}$ without regard to $R_f$.

The input-output relationship of the second-stage resistor-load MOS amplifier is as follow wherein $K_2$ is the constant of the MOS transistor $M_2$, $V_{th2}$ is the threshold voltage of $M_2$ and $R_2$ is the load resistor.

$$K_1 R_1 = K_2 R_2 \quad (9)$$

If the following is established, $$V_{th1} = V_{th2} \quad (10)$$

From the equation (8), $$V_{out2} = V_{in2} = V_{out1} = V_{in1} \quad (11)$$

It can be considered that temperature-dependent variations in $K_1$, $K_2$, $V_{th1}$, $V_{th2}$, the resistors $R_1$ and $R_2$ are not varied when implemented with integrated circuit technology. The equation (11) is therefore seemed almost practical for use. The amplifier of FIG. 21 eliminates the need for capacitor coupling and exhibits the substantially stable performance characteristics.

Figure 22:
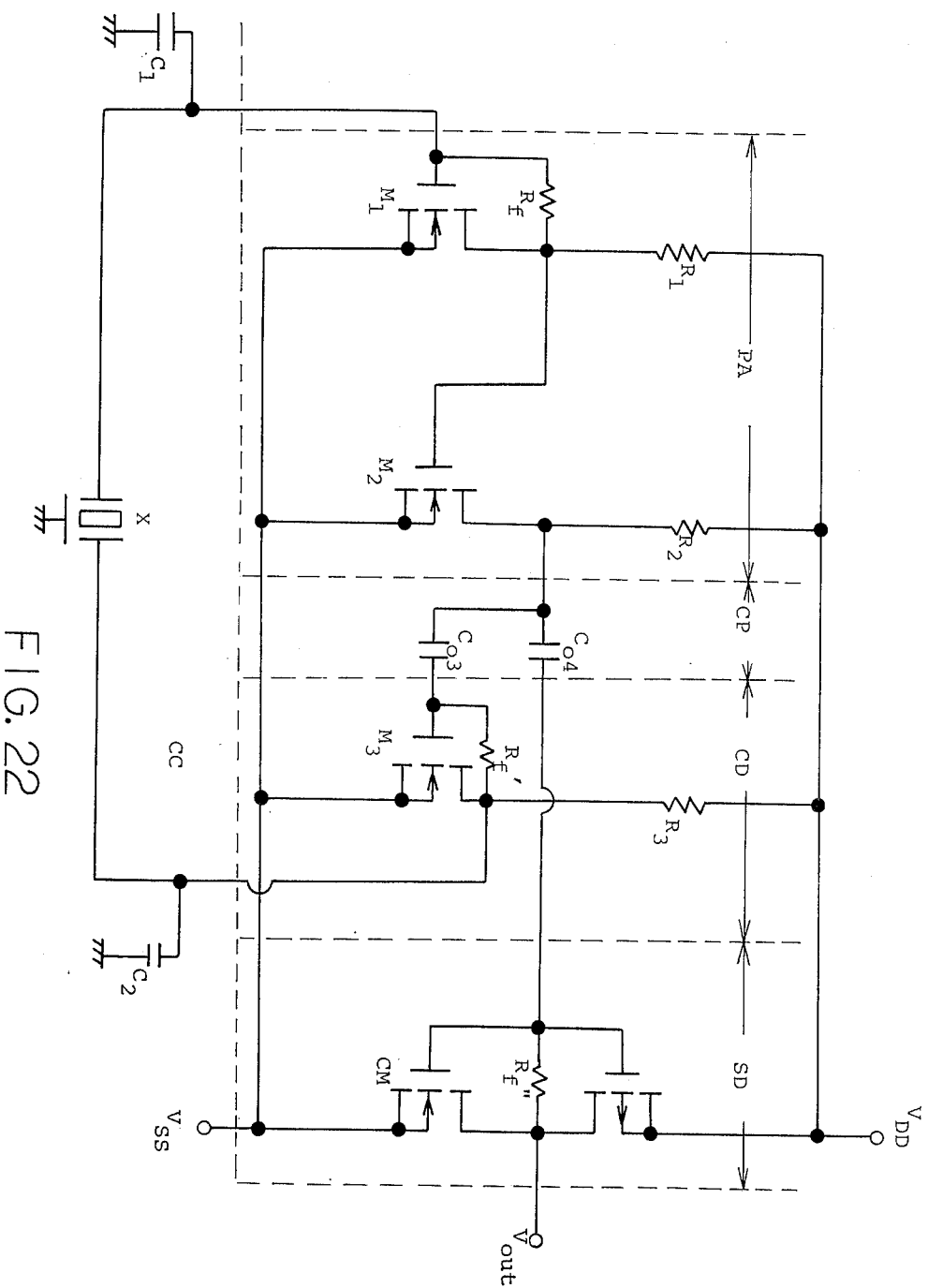
FIG. 22 is a circuit diagram of an oscillator incorporating the embodiment of FIG. 21 thereinto.

FIG. 22 shows an application to an oscillator containing a quartz oscillator of higher CI. A quartz enabling stage CD consisting of a load resistor $R_3$ and a MOS transistor $M_3$ serves to excite a quartz current CC. Biasing is accomplished by $R_f'$. A pre-amplifier PA as suggested by FIG. 21 is coupled via a capacitor $C_{03}$ with the quartz enabling stage CD.

Figure 23:
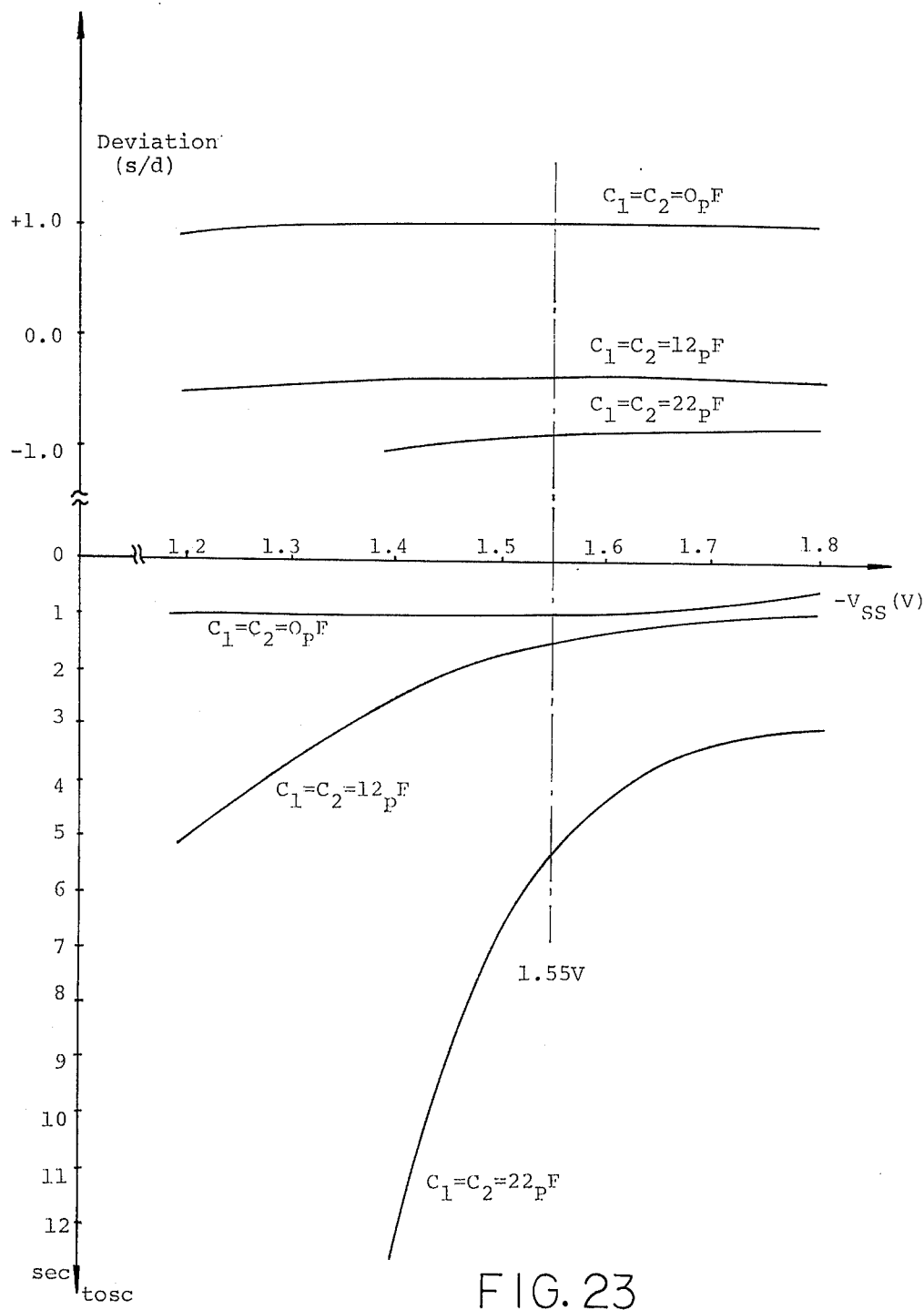
FIGS. 23 and 24 are graphic representations of operating characteristics of the circuit of FIG. 22.
Figure 24:
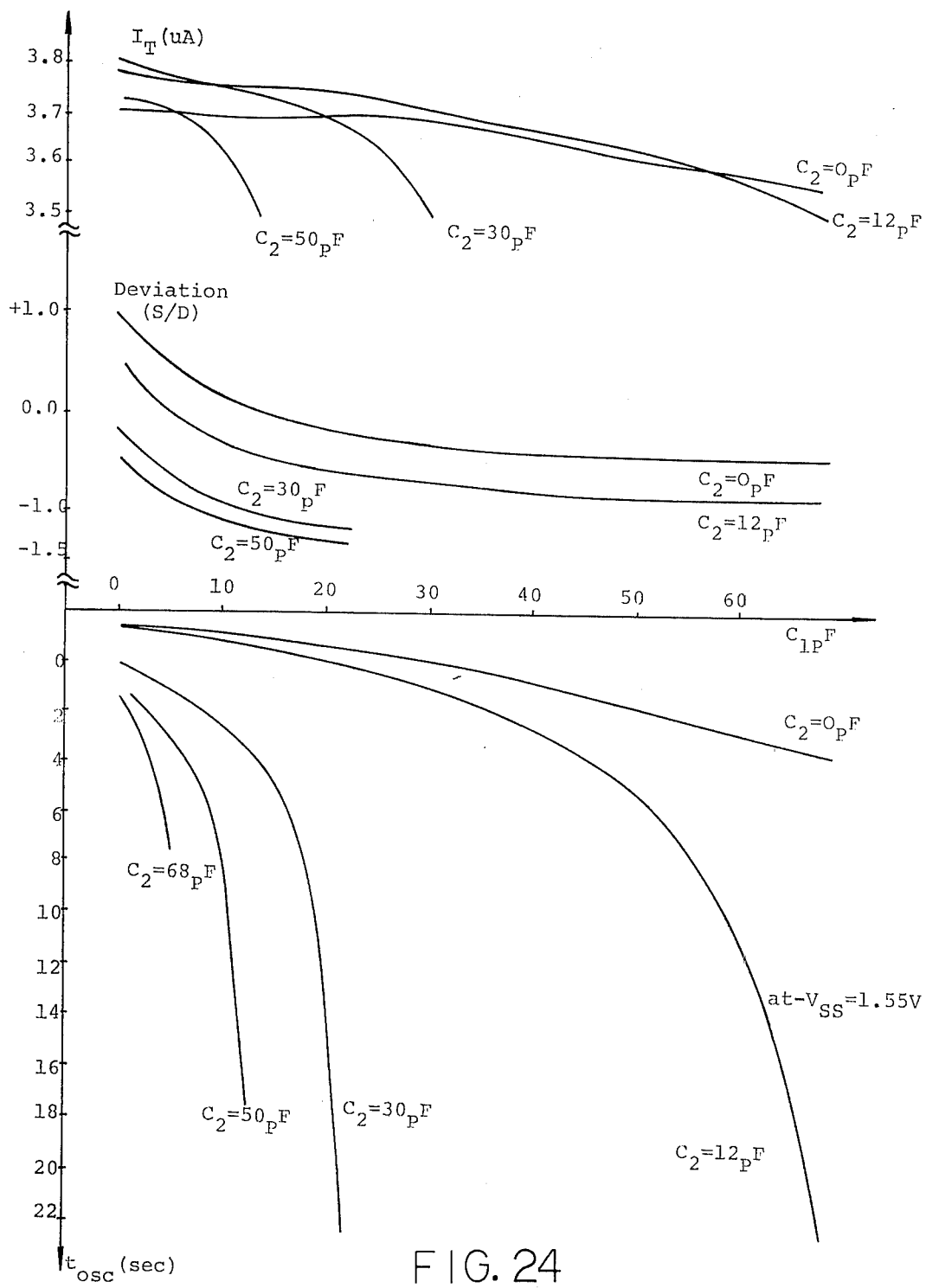

FIG. 23 illustrates deviation sec/day and a period of time required for initiating oscillation tosc as a function of the power supply voltage $V_{ss}$ and external capacitors $C_1$ and $C_2$. The greater the deviation the greater the capacitors $C_1$ and $C_2$. The most favorable results are obtained at 0–0.5 S/D · $V_{out}$. When the external capacitors are not coupled, the period $t_{osc}$ takes a minimum (shorter than 1.0 sec.). FIG. 24 depicts the total consumption current $I_T (\mu A)$, the deviation (sec/day) and the oscillation period $t_{osc}$ (sec.) when the power supply voltage $V_{DD} - V_{SS}$ is 1.55V and the external capacitors $C_1$ and $C_2$ are altered.

While only certain embodiments of the present invention have been described, it will be apparent to those skilled in the art that various changes and modifications may be made therein without departing from the spirit and scope of the invention as claimed.

What is claimed is:

1. An oscillator comprising:
   a complementarily connected transistor amplifier which performs linear operation;
   an impedance converter of which the input is connected to the output of the complementarily connected transistor amplifier, thereby stabilizing and reducing output impedance of the amplifier; and
   a quartz oscillator connected between the input of the complementarily connected transistor amplifier and the output of the output impedance converter.

2. An oscillator as defined in claim 1, wherein said impedance converter includes an active element selected from the group of elements including a MOSFET, a junction type FET and a bipolar transistor.

3. An oscillator as defined in claim 2 wherein a resistor is connected to the output of the impedance converter to form a follower arrangement.

4. An oscillator as defined in claim 1 wherein the complementarily connected transistor amplifier is constituted by a CMOS amplifier.

5. An oscillator as defined in claim 1 wherein the quartz oscillator has a high crystal impedance.

6. An oscillator comprising:
   at least one complementarily connected transistor amplifier stage which performs linear operation;
   a resistor-load amplifier of which the input is connected to the output of the complementarily connected transistor amplifier stages, thereby stabilizing and reducing output impedance of the amplifier while keeping high gain; and
   a quartz oscillator connected between the input of the complementarily connected transistor amplifier and the output of the output impedance converter.

7. An amplifier as defined in claim 6 wherein the complementarily connected amplifier stage and the resistor-load amplifier are respectively provided with biasing means.

* * * * *